US012476089B2

(12) United States Patent
Na et al.

(10) Patent No.: US 12,476,089 B2
(45) Date of Patent: Nov. 18, 2025

(54) PLASMA PROCESSING APPARATUS

(71) Applicant: Samsung Electronics Co., Ltd., Suwon-si (KR)

(72) Inventors: Donghyeon Na, Suwon-si (KR); Jaebin Kim, Suwon-si (KR); Myeongsoo Shin, Suwon-si (KR); Dongseok Han, Suwon-si (KR); Kyungsun Kim, Suwon-si (KR); Namkyun Kim, Suwon-si (KR); Jaesung Kim, Suwon-si (KR); Seungbo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 311 days.

(21) Appl. No.: 18/295,466

(22) Filed: Apr. 4, 2023

(65) Prior Publication Data

US 2024/0038505 A1 Feb. 1, 2024

(30) Foreign Application Priority Data

Jul. 29, 2022 (KR) ........................ 10-2022-0095007

(51) Int. Cl.
*H01J 37/32* (2006.01)
*H01J 37/20* (2006.01)

(52) U.S. Cl.
CPC .......... *H01J 37/3266* (2013.01); *H01J 37/20* (2013.01); *H01J 37/32532* (2013.01)

(58) Field of Classification Search
CPC .. H01J 37/3266; H01J 37/20; H01J 37/32532; H01J 37/32669; H01J 37/32431; H01J 37/32715; H01J 2237/334; H01L 21/67017; H01L 21/67069
See application file for complete search history.

(56) References Cited

U.S. PATENT DOCUMENTS

| | | | | |
|---|---|---|---|---|
| 5,391,281 | A | 2/1995 | Hieronymi et al. | |
| 5,733,405 | A | 3/1998 | Taki et al. | |
| 7,338,576 | B2 | 3/2008 | Ono et al. | |
| 7,556,718 | B2 | 7/2009 | Brcka | |
| 8,884,526 | B2 | 11/2014 | Lin et al. | |
| 9,646,843 | B2 | 5/2017 | Nguyen et al. | |
| 10,734,205 | B2 | 8/2020 | Iwano et al. | |
| 10,784,085 | B2 | 9/2020 | Ramaswamy et al. | |
| 11,133,157 | B2 | 9/2021 | Yokota et al. | |
| 2022/0157563 | A1* | 5/2022 | Sun | H01J 37/3405 |
| 2022/0384164 | A1* | 12/2022 | Bangalore Umesh | C23C 14/54 |

FOREIGN PATENT DOCUMENTS

JP 2021188113 A 12/2021

* cited by examiner

*Primary Examiner* — Renan Luque
(74) *Attorney, Agent, or Firm* — Wolf, Greenfield & Sacks, P.C.

(57) ABSTRACT

A plasma processing apparatus includes a wafer support fixture in the chamber and configured to support a wafer, an upper electrode in the chamber and spaced apart from the wafter support fixture, a magnet assembly configured to apply a magnetic field into a chamber, the magnet assembly including a plurality of first magnets and a plurality of second magnets arranged in an annular shape, and a horizontal distance from a central axis of the chamber to each of the plurality of first magnets and each of the plurality of second magnets is less than a radius of the wafer.

19 Claims, 13 Drawing Sheets

PLASMA PROCESSING APPARATUS

CROSS-REFERENCE TO RELATED APPLICATION

This application is based on and claims priority under 35 U.S.C. § 119 to Korean Patent Application No. 10-2022-0095007, filed on Jul. 29, 2022, in the Korean Intellectual Property Office, the disclosure of which is incorporated by reference herein in its entirety.

BACKGROUND

The inventive concept relates to a plasma processing apparatus.

A process of manufacturing semiconductor devices includes a plasma process, such as plasma induced deposition, plasma etching, and plasma cleaning. With the recent miniaturization and high integration of semiconductor devices, the influence of minute errors in the plasma process on quality and yield of semiconductor products increases.

In manufacturing semiconductor devices including a plasma process, a key factor determining yield includes process uniformity between a central region and an edge region of a wafer. For example, a change according to a radius in evaluation factors of a process, such as orthogonality of a plasma etching profile, is as important to determining the total yield as the evaluation factors themselves.

That is, a key parameter for improving the reliability of a plasma apparatus is a density-radius distribution of plasma. Accordingly, various studies have been conducted to improve the uniformity of the density-radius distribution of plasma.

SUMMARY

The inventive concept provides a plasma processing apparatus having improved reliability.

According to an aspect of the inventive concept, there is provided a plasma processing apparatus. The plasma processing apparatus includes a wafer support fixture in a chamber and configured to support a wafer, an upper electrode in the chamber and spaced apart from the wafer support fixture, and a magnet assembly configured to apply a magnetic field into the chamber, wherein the magnet assembly includes a plurality of first magnets and a plurality of second magnets arranged in an annular shape, and a horizontal distance from a central axis of the chamber to each of the plurality of first magnets and to each of the plurality of second magnets is less than a radius of the wafer.

According to another aspect of the inventive concept, there is provided a plasma processing apparatus. The plasma processing apparatus includes a chamber configured to provide a plasma region in which plasma is generated, a wafer support fixture configured to receive bias power for accelerating positive ions included in the plasma, a controller, and a first magnet assembly configured to adjust a density-radius distribution of the plasma in the chamber, wherein the first magnet assembly includes a plurality of first magnets and a plurality of second magnets arranged in a ring shape, the controller is configured to rotate the plurality of first magnets and the plurality of second magnets such that a direction extending away from an N pole of each of the plurality of first magnets and the plurality of second magnets can have any angle with respect to vertical, and the controller is configured to rotate the plurality of first magnets separately from the plurality of second magnets.

According to another aspect of the inventive concept, there is provided a plasma processing apparatus. The plasma processing apparatus includes a chamber configured to provide a plasma region in which plasma is generated, and a magnet assembly configured to adjust a density-radius distribution of the plasma in the chamber by applying a magnetic field to the plasma region, wherein the magnet assembly includes a plurality of first magnets and a plurality of second magnets arranged in a ring, the plurality of first magnets and the plurality of second magnets are configured to rotate about a circumference of the ring, the magnet assembly is configured to rotate the plurality of first magnets and the plurality of second magnets in a first direction to set an intensity of the magnetic field at a central portion of the chamber to be greater than an intensity of the magnetic field in an edge portion of the chamber, and the magnet assembly is configured to rotate the plurality of first magnets and the plurality of second magnets in a second direction opposite to the first direction to set the intensity of the magnetic field at the central portion of the chamber to be less than the intensity of the magnetic field in the edge portion of the chamber.

According to another aspect of the inventive concept, there is provided a method of manufacturing a semiconductor device. The method includes generating plasma in a plasma region of a chamber, applying a magnetic field to the plasma region, and changing the magnetic field applied to the plasma region, wherein the magnetic field is applied by a magnet assembly including a plurality of first magnets and a plurality of second magnets arranged in an annular shape with respect to a central axis of the chamber, the changing of the magnetic field applied to the chamber is performed by rotating the plurality of first magnets and the plurality of second magnets, and the plurality of first magnets rotate separately from the plurality of second magnets.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
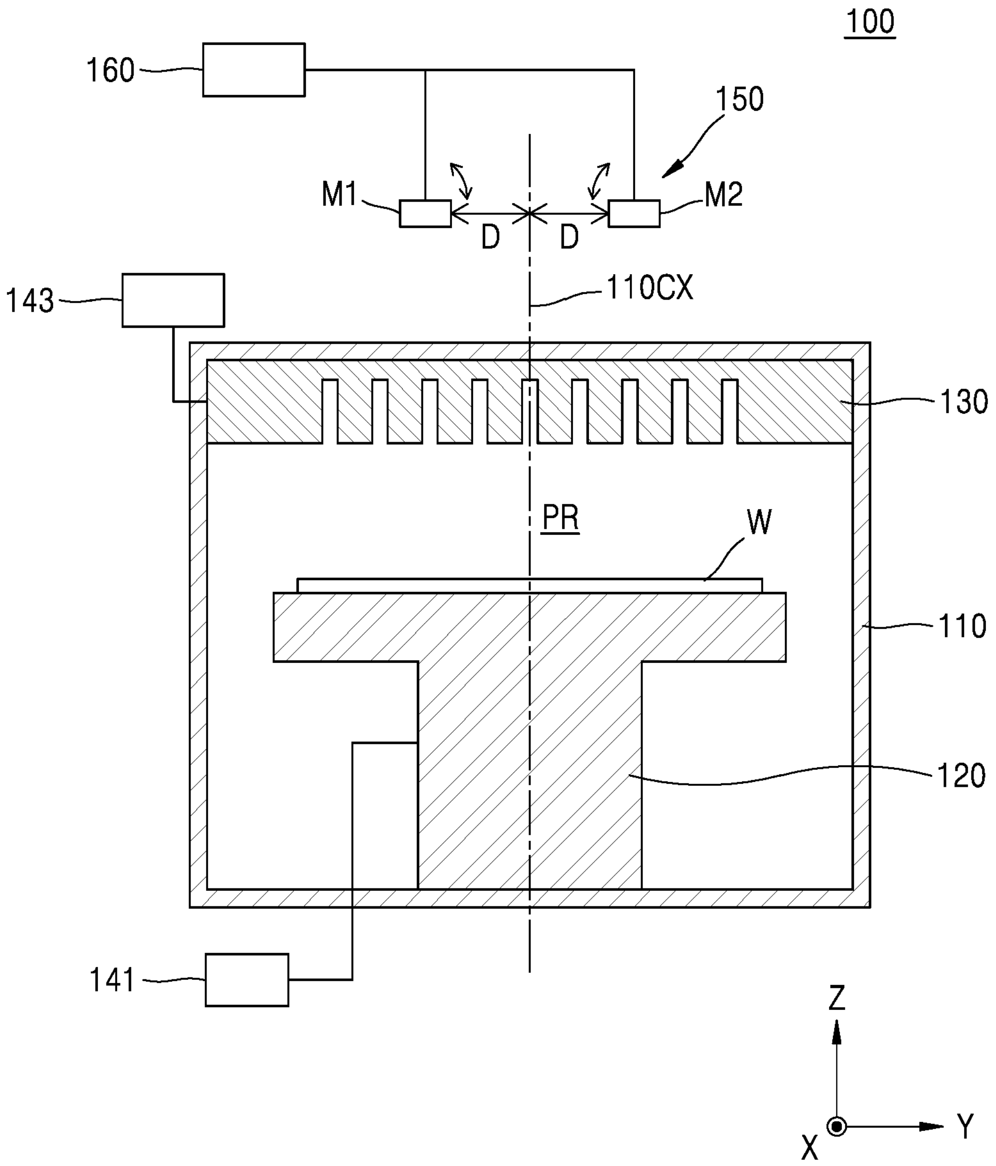
FIG. 1 illustrates a plasma processing apparatus according to example embodiments.

Hereinafter, embodiments of the inventive concept will be described in detail with reference to the accompanying drawings. The same reference numerals are used for the same components in the drawings, and redundant descriptions thereof are omitted.

FIG. 1 illustrates a plasma processing apparatus 100 according to example embodiments.

Figure 2:
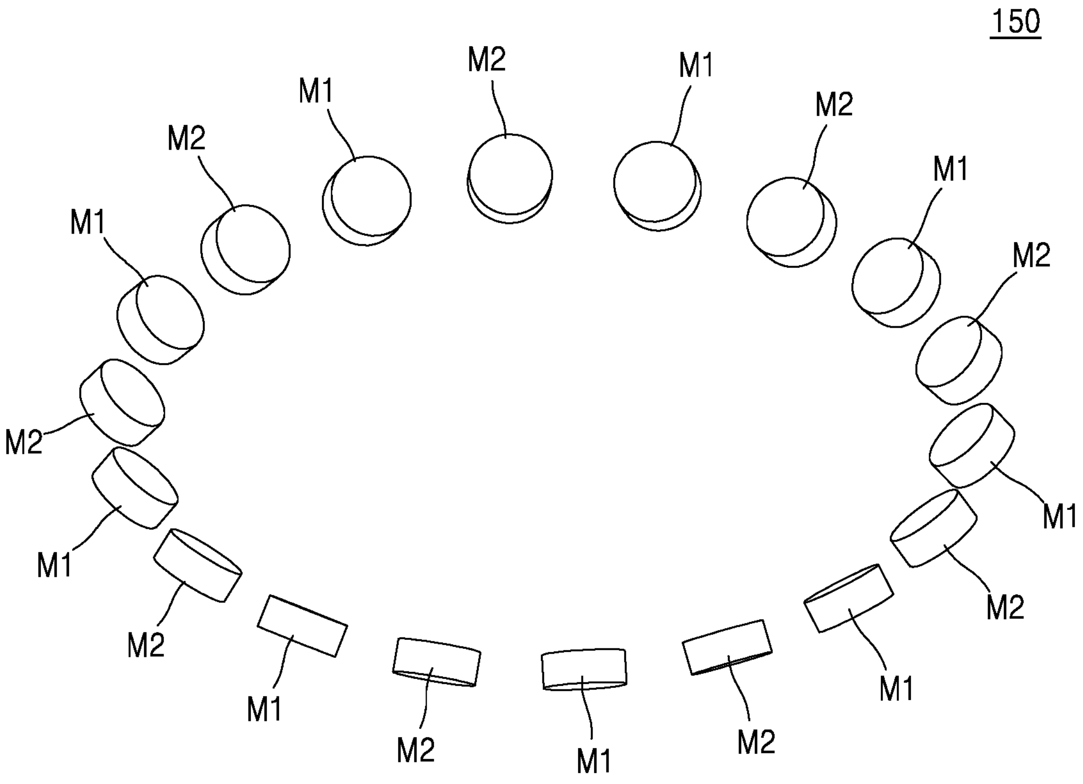
FIG. 2 illustrates a magnet assembly of a plasma processing apparatus.

FIG. 2 illustrates a magnet assembly 150 of the plasma processing apparatus 100.

Referring to FIGS. 1 and 2, the plasma processing apparatus 100 includes a chamber 110, a wafer support fixture 120, an upper electrode 130, a first power generator 141, a second power generator 143, the magnet assembly 150, and a controller 160.

The plasma processing apparatus 100 may perform a process using plasma. The plasma processing apparatus 100 may perform a semiconductor device manufacturing process. The plasma processing apparatus 100 may perform, for example, an etching process using plasma. In another example, the plasma processing apparatus 100 may also perform wafer processing processes, such as plasma annealing, etching, plasma-enhanced chemical vapor deposition, plasma-enhanced atomic layer deposition, physical vapor deposition, and plasma cleaning.

When the plasma processing apparatus 100 performs an etching process using plasma, the plasma may be generated by high-frequency discharge between the wafer support fixture 120 and the upper electrode 130. A film to be processed on a wafer W may be etched in a set pattern by activated chemical species, electrons and/or ions of the plasma. According to the present embodiment, etching performance, such as an etching rate according to a distance from the center of a wafer, an aspect ratio, a critical dimension of an etching pattern, a profile of the etch pattern, and selectivity, may be uniformized by precisely controlling a density-radius distribution of chemical species, electrons, and ions of plasma, The wafer W may include silicon (Si). The wafer W may include a semiconductor element, such as germanium (Ge), or a compound semiconductor, such as silicon carbide (SiC), gallium arsenide (GaAs), indium arsenide (InAs), or indium phosphide (InP). According to some embodiments, the wafer W may have a silicon on insulator (SOI) structure. The wafer W may include a buried oxide layer. According to some embodiments, the wafer W may include a conductive region, for example, a well doped with an impurity. According to some embodiments, the wafer W may have various device isolation structures, such as a shallow trench isolation (STI), for separating doped wells from each other. The wafer W may have a first surface that is an active surface and a second surface that is an inactive surface opposite to the first surface. The second surface of the wafer W may face the wafer support fixture 120.

Here, two directions parallel to the first surface of the wafer W and perpendicular to each other are defined respectively as an X direction and a Y direction, and a direction perpendicular to the first surface of the wafer W is defined as a Z direction. Unless otherwise stated, the definitions of the directions are applied to the drawings below in the same manner. The directions defined for the first surface of the wafer W may be defined in substantially the same manner with reference to an upper surface of the wafer support fixture 120.

The chamber 110 may include a metal, such as aluminum. The chamber 110 may have a substantially cylindrical shape. The chamber 110 may provide a processing space for processing the wafer W. The chamber 110 may isolate the processing space from the outside, and thus, process parameters, such as pressure, temperature, partial pressure of processing gas, and plasma density, may be precisely controlled. The chamber 110 (an internal space of the chamber 110) may have cylindrical symmetry.

In example embodiments, the chamber 110 may provide a plasma region PR. The plasma region PR collectively refers to a space in which plasma is generated during processing of the wafer W and a space affected by plasma, such as a sheath region. The plasma region PR may be simply a space between the wafer support fixture 120 and the upper electrode 130.

The chamber 110 may be connected to a gas source for supplying a processing gas to the chamber 110 and may further include a discharge device for discharging reactants, debris, processing gas, and plasma after processing the wafer W.

The wafer support fixture 120 may support the wafer W. The wafer support fixture 120 may include a ceramic material, such as aluminum nitride (AlN), or a metal material, such as aluminum or a nickel-based alloy. The wafer support fixture 120 may include a heater for temperature control of the wafer W. The heater may be built into a support plate of the wafer support fixture 120. The wafer support fixture 120 may move the wafer W up and down or rotate the wafer W.

A plurality of (for example, three) support pins may be buried in the wafer support fixture 120. The support pins may protrude from an upper surface (that is, a surface supporting the wafer W) of the wafer support fixture 120 to separate the wafer W from the wafer support fixture 120. The wafer W may be picked up and put down (raised and lowered) by the operations of the support pins.

The wafer support fixture 120 may fix the wafer W. The wafer support fixture 120 may fix the wafer W by using an electrostatic force. Bias power may be applied to the wafer support fixture 120. The bias power may accelerate positive ions included in plasma. The accelerated positive ions may etch a material to be etched on the wafer W.

The upper electrode 130 may include, for example, a metal material. The upper electrode 130 may face the wafer support fixture 120. The upper electrode 130 may be fixed to the ceiling of the chamber 110.

The upper electrode 130 may supply processing gas into the chamber 110 in the form of water sprayed from a shower. The upper electrode 130 may provide a space for uniformly spreading the processing gas introduced into the chamber 110 through a pipe. Accordingly, the upper electrode 130 enables the processing gas to be uniformly supplied to the plasma region PR.

Source power for generating plasma may be applied to the upper electrode 130.

The second power generator 143 may generate the source power. The second power generator 143 may provide a first output voltage to the upper electrode 130. In a non-limiting example, the second power generator 143 may include a radio frequency (RF) power generator, and the source power may include an RF sinusoidal voltage. The source power generated by the second power generator 143 may also be non-sinusoidal.

The first power generator 141 may generate bias power. The wafer support fixture 120 may include a lower electrode configured to receive bias power. For example, an upper plate of the wafer support fixture 120 may include the lower electrode. The first power generator 141 may provide the bias power to the wafer support fixture 120. The bias power may control ion energy of plasma. When the bias power is provided to the wafer support fixture 120, a voltage may be induced in the wafer W on the wafer support fixture 120. The voltage of the wafer W may be controlled by adjusting the bias power, and accordingly, the ion energy of the plasma generated in the chamber 110 may be controlled.

As described above, an embodiment is described in which source power is applied to the upper electrode 130 and bias power is applied to the wafer support fixture 120, but the embodiment is for the sake of convenience of description and does not limit the technical idea of the inventive concept in any sense. For example, pieces of source power having different frequencies may be provided to the plasma processing apparatus 100, some of the pieces of source power may be applied to the upper electrode 130, and the others may be applied to the wafer support fixture 120. In another example, a ground potential may be applied to the upper electrode 130, and source power and bias power may each be applied to the wafer support fixture 120. Those skilled in the art will be able to easily implement examples of a plasma processing apparatus having the above-described power transfer structure based on the description herein.

The magnet assembly 150 may apply a magnetic field to the plasma region PR in the chamber 110. The magnet assembly 150 may adjust a distribution (hereinafter, a magnetic field-radius distribution) according to a radius of the magnetic field. The magnetic field applied to plasma affects the density of the plasma. Accordingly, the magnet assembly 150 may adjust the magnetic field-radius distribution of the plasma region PR to adjust a density-radius distribution of plasma.

The adjustment of the magnetic field-radius distribution of the magnet assembly 150 may be controlled by the controller 160 as will be described below, and the controller 160 may generate a signal for controlling the magnet assembly 150 based on previously known information between the density-radius distribution of plasma and the magnetic field-radius distribution of the plasma region PR.

The magnet assembly 150 may uniformize a radius-plasma density distribution in the plasma region PR by applying a magnetic field to the plasma region PR. Accordingly, it is possible to improve uniformity according to a radius of processing using plasma.

In addition, the magnetic field applied by the magnet assembly 150 may cancel a horizontal acceleration of positive ions of plasma. Accordingly, orthogonality of an etch profile of an etch process by the plasma processing apparatus 100 may be improved.

The magnet assembly 150 may be arranged over (that is, over the ceiling of the chamber 110) the chamber 110. The magnet assembly 150 may be separated or spaced apart from the wafer support fixture 120 with the upper electrode 130 therebetween.

The magnet assembly 150 may include a plurality of first magnets M1 and a plurality of second magnets M2. In a non-limiting example, the plurality of first magnets M1 and the plurality of second magnets M2 may include permanent magnets. The plurality of first magnets M1 and the plurality of second magnets M2 may also include electromagnets.

The plurality of first magnets M1 and the plurality of second magnets M2 may be arranged in an annular or ring shape. The plurality of first magnets M1 and the plurality of second magnets M2 may be at the same distance D from a central axis 110CX of the chamber 110. That is, a distance (for example, a horizontal distance) from each of the plurality of first magnets M1 to the central axis 110CX of the chamber 110 may be referred to as a distance D, and a distance (for example, a horizontal distance) from each of the plurality of second magnets M2 to the central axis 110CX of the chamber 110 may be referred to as the distance D. Magnets included in the magnet assembly 150 may be arranged on a reference plane provided outside the chamber 110, and the magnets included in the magnet assembly 150 may be arranged at equal intervals along an arrangement line of a ring shape having a center that meets the central axis 110CX of the chamber 110.

The plurality of first magnets M1 may be alternately arranged with the plurality of second magnets M2. For example, any one of the plurality of second magnets M2 may be between adjacent two of the plurality of first magnets M1, and any one of the plurality of first magnets M1 may be between adjacent two of the plurality of second magnets M2.

The plurality of first magnets M1 may be rotationally symmetric to the plurality of second magnets M2. That is, by rotating the plurality of first magnets M1 in a radial direction, the plurality of first magnets M1 may overlap the plurality of second magnets M2, and vice versa.

According to example embodiments, the distance D may be less than a radius of the wafer W. For example, when the wafer W has a diameter of 300 mm, the distance D may be less than 150 mm.

Each of the plurality of first magnets M1 and the plurality of second magnets M2 may be coupled to a magnet holder having an adjustable orientation direction. According to example embodiments, a magnetic field-radius distribution within the plasma region PR may be changed by adjusting directions of the plurality of first magnets M1 and the plurality of second magnets M2 by the magnet holder.

According to example embodiments, each of the plurality of first magnets M1 may rotate such that a direction of each of the plurality of first magnets M1 has a certain spatial angle. According to example embodiments, each of the plurality of second magnets M2 may rotate such that a direction of each of the plurality of second magnets M2 has a certain spatial angle. The direction of each of the plurality of first magnets M1 and the direction of each of the plurality of second magnets M2 may be characterized as directions indicated by an N pole of each of the plurality of first magnets M1 and an N pole of each of the plurality of second magnets M2. In other words, the direction of each of the plurality of first magnets M1 and the direction of each of the plurality of second magnets M2 may be substantially the same as the directions indicated by the N pole of each of the plurality of first magnets M1 and the N pole of each of the plurality of second magnets M2. For example, a direction and a spatial angle of each of the plurality of first magnets M1 may be defined respectively as the direction indicated by each of the N poles of the plurality of first magnets M1 and an angle between the central axis 110CX of the chamber 110, and a direction and a spatial angle of each of the plurality of second magnets M2 may be defined respectively as the direction indicated by each of the N poles of the plurality of second magnets M2 and the angle between the central axis 110CX of the chamber 110.

According to example embodiments, the controller 160 may control an operation of the magnet assembly 150. According to example embodiments, the controller 160 may control the direction of each of the plurality of first magnets M1 and the direction of each of the plurality of second magnets M2 to adjust a magnetic field of the plasma region PR.

According to example embodiments, the controller 160 may include a memory and a processor for processing a command stored in the memory or an external control signal. The controller 160 may include hardware, firmware, software, or any combination thereof. For example, the controller 160 may include a computing device, such as a workstation computer, a desktop computer, a laptop computer, or a tablet computer. The controller 160 may also include a simple controller, a complex processor, such as a microprocessor, a central processing unit (CPU), or a graphics processing unit (GPU), a processor configured with software, and dedicated hardware or firmware. The controller 160 may be implemented by, for example, a general-purpose computer, a digital signal processor (DSP), an application-specific hardware, such as a field programmable gate array (FPGA) or an application specific integrated circuit (ASIC), or so on.

According to some embodiments, operations of the controller 160 may be implemented by instructions stored on a machine-readable medium which may be read and executed by one or more processors. Here, the machine-readable medium may include any mechanism for storing and/or transmitting information in a form readable by a machine (for example, a computing device). For example, machine-readable media may include read only memory (ROM), random access memory (RAM), a magnetic disk storage medium, an optical storage medium, flash memory devices, electrical, optical, acoustic, or a propagation signal (for example, a carrier signal, an infrared signal, a digital signal, or so on) of another form, and any other signal.

Firmware, software, routines, and instructions may also be configured to perform the operations described for the controller 160 or any process described below. However, this is for the sake of convenience of description, and operations of the above-described memory and processor may also be caused by a computing device, a processor, a controller, or other devices executing firmware, software, routines, instructions, and so on.

Figure 3:
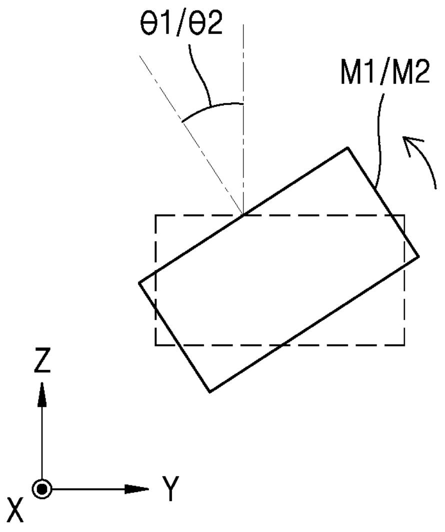
FIG. 3 is a view illustrating directions of a plurality of first magnets and a plurality of second magnets according to example embodiments.

FIG. 3 is a view illustrating directions of the plurality of first magnets M1 and the plurality of second magnets M2 according to example embodiments.

Figure 4:
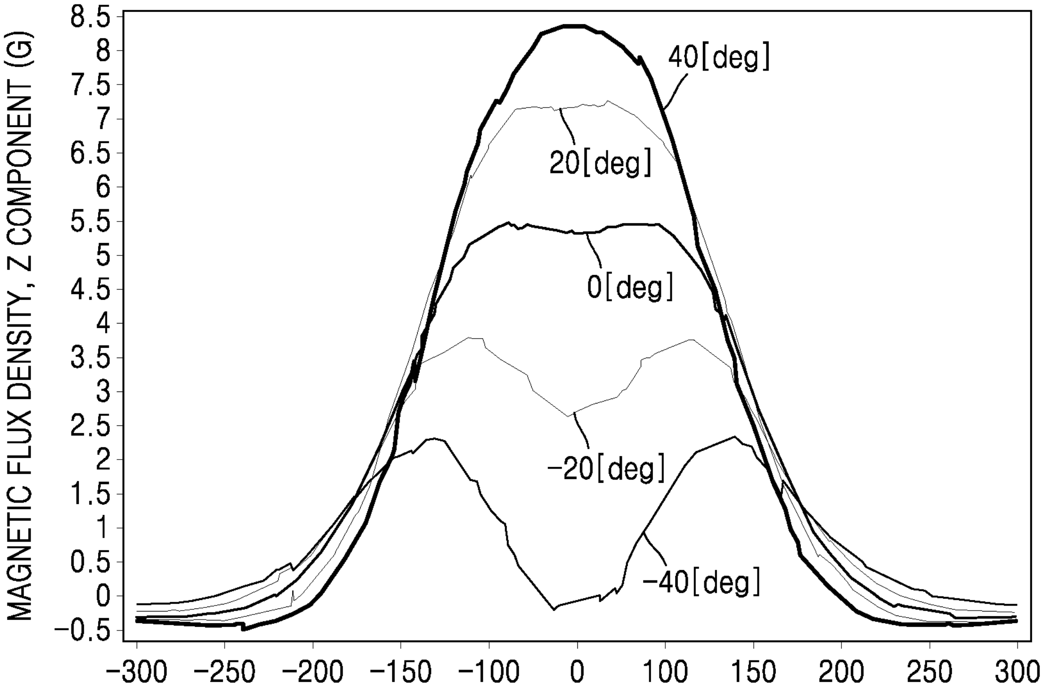
FIG. 4 illustrates a change in a Z-direction magnetic field-radius distribution of a plasma region according to an operation of a magnet assembly, according to example embodiments.

FIG. 4 illustrates a change in a Z-direction magnetic field-radius distribution of the plasma region PR according to an operation of the magnet assembly 150 according to example embodiments.

Referring to FIGS. 1 to 3, when N poles of the plurality of first magnets M1 and N poles of the plurality of second magnets M2 are in the Z direction, angles of the plurality of first magnets M1 and angles of the plurality of second magnets M2 are defined as 0 degrees.

In a non-limiting example, a case in which each of the plurality of first magnets M1 and the plurality of second magnets M2 rotate on a plane including a radial direction from the central axis 110CX of the chamber 110 will be described below. That is, in the present example, each of the plurality of first magnets M1 and each of the plurality of second magnets M2 may rotate about an axis parallel to an azimuthal direction with respect to the central axis 110CX of the chamber 110. In some embodiments, the each of the plurality of first magnets M1 and each of the plurality of second magnets M2 may rotate about a curved circumferential axis defined by the ring of magnets (or about a circumference of the ring).

The plurality of first magnets M1 may be driven to be inclined at a first angle θ1 with respect to the Z direction by a magnet holder, and the plurality of second magnets M1 may be driven to be inclined at a second angle θ2 with respect to the Z direction by the magnet holder.

Referring to FIGS. 1 to 4, a magnetic field-radius distribution in the chamber 110 may be changed by adjusting the first angle θ1 of each of the plurality of first magnets M1 and the second angle θ2 of each of the plurality of second magnets M2.

In the present example, the plurality of first magnets M1 and the plurality of second magnets M2 may be driven in substantially the same manner. More specifically, the first angle θ1 of each of the plurality of first magnets M1 may be substantially equal to the second angle θ2 of each of the plurality of second magnets M2. That is, the controller 160 may control rotations of the plurality of first magnets M1 and rotations of the plurality of second magnets M2 by controlling the magnet assembly 150 such that the first angle θ1 of each of the plurality of first magnets M1 is equal to the second angle θ2 of each of the plurality of second magnets M2.

When the first angle θ1 and the second angle θ2 are 40 degrees, a Z-direction magnetic field in the plasma region PR may have a bell-shaped distribution having a peak at the center of the plasma region PR. When the first angle θ1 and the second angle θ2 change from 40 degrees to 20 degrees and 0 degrees, a peak of the center of the Z-direction magnetic field-radius distribution in the plasma region PR may be gradually flattened. When the first angle θ1 and the second angle θ2 are −20 degrees, the intensity of a magnetic field in the Z direction may be greater at an edge than in the center of the plasma region PR. In this case, the Z-direction magnetic field-radius distribution may have a local peak at the edge of the plasma region PR. The local peak of the edge may be at a position smaller than a radius of the wafer W. For example, when a wafer W having a diameter of 300 mm is processed, a position of the local peak of the edge may be in a range of about 50 mm to about 150 mm from the center of the plasma region PR.

In other words, the controller 160 may generate a signal for adjusting the first angle θ1 and the second angle θ2 based on a process recipe to set the intensity of the Z-direction magnetic field near the center of the wafer W to be greater than the intensity of the Z-direction magnetic field at an edge of the wafer W or set the intensity of the Z-direction magnetic field near the center of the wafer W to be less than the intensity of the Z-direction magnetic field at an edge of the wafer W.

For example, the plurality of first magnets M1 and the plurality of second magnets M2 may rotate in a first rotation direction corresponding to a positive angle in the embodiment of FIG. 4, and thus, the intensity of a magnetic field in a central portion of the plasma region PR may be relatively strengthened. In addition, for example, the plurality of first magnets M1 and the plurality of second magnets M2 may rotate in a second rotation direction corresponding to a negative angle in the embodiment of FIG. 4, and thus, the intensity of the magnetic field in the central portion of the plasma region PR may be relatively strengthened. The first rotation direction may be opposite to the second rotation direction.

Accordingly, the plasma processing apparatus 100 may uniform the plasma density-radius distribution. For example, when plasma density of the central portion is higher than plasma density of an edge portion of the plasma region PR, the magnet assembly 150 may be driven to reduce the plasma density of the central portion of the plasma region PR. In another example, when the plasma density of the central portion is lower than the plasma density of an edge portion of the plasma region PR, the magnet assembly 150 may be driven to increase the plasma density of the central portion of the plasma region PR. The purpose of the operation of the magnet assembly 150 may be to uniformize the density and radius of plasma, as described above. In addition, the operation of the magnet assembly 150 may be performed based on a signal of the controller 160 for adjusting the first angle θ1 of each of the plurality of first magnets M1 and the second angle θ2 of each of the plurality of second magnets M2.

Figure 5A:
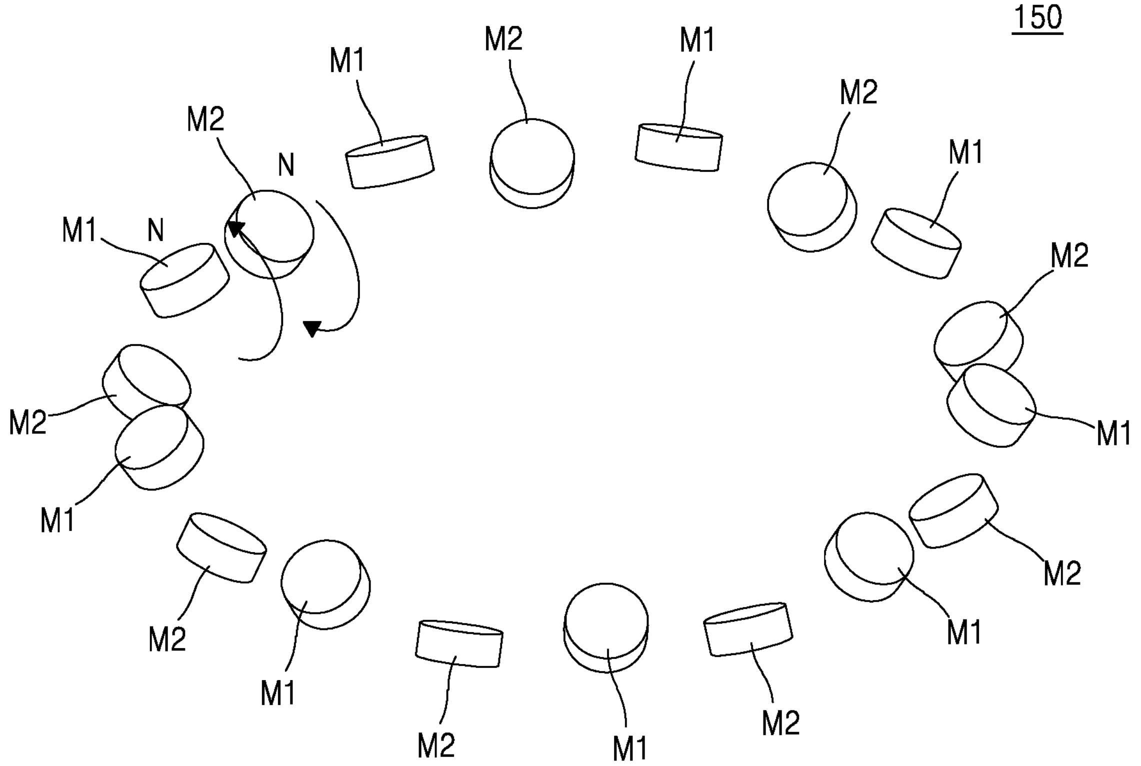
FIGS. 5A to 5C are views illustrating operations of a magnet assembly.
Figure 5B:
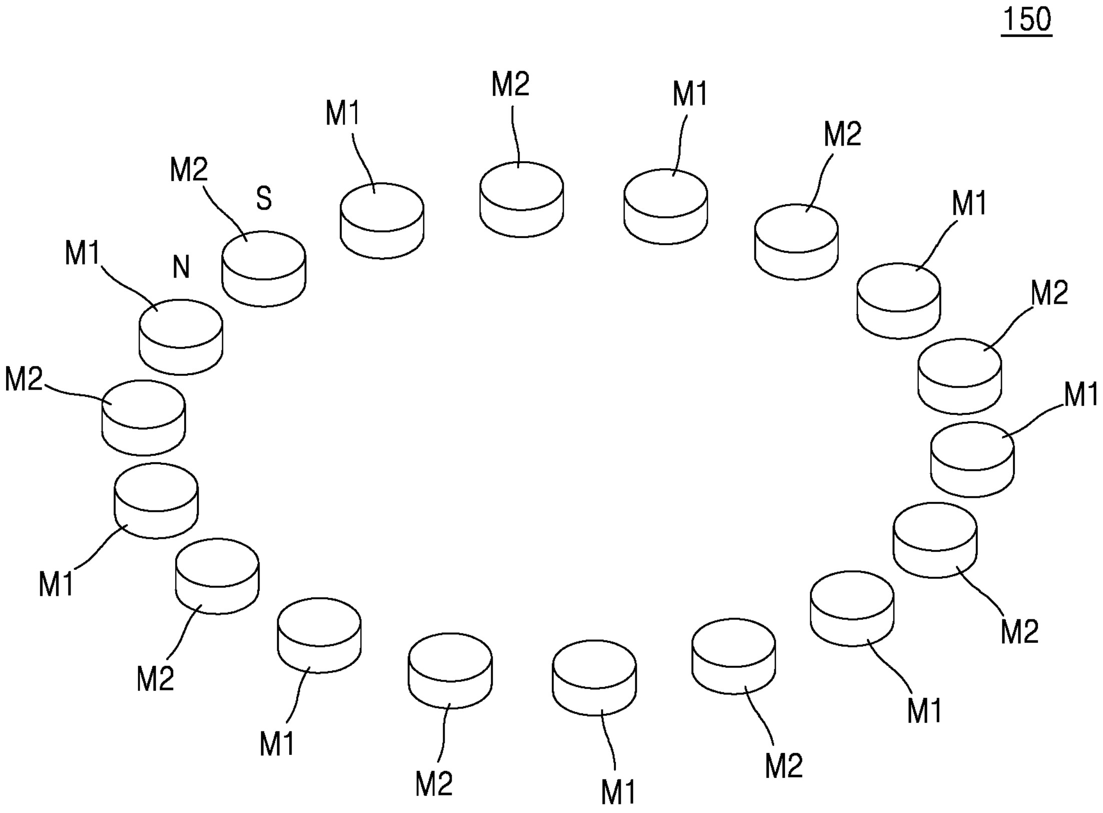
Figure 5C:
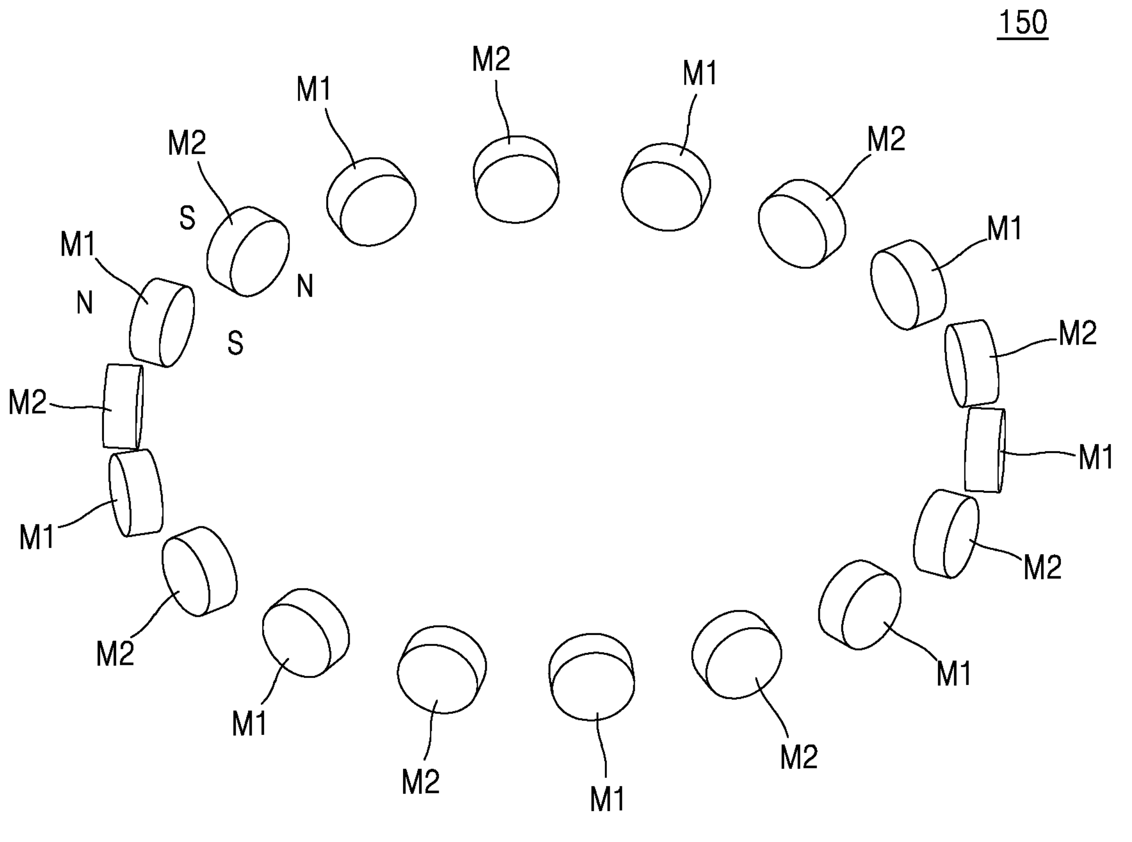

FIGS. 5A to 5C are views illustrating operations of the magnet assembly 150.

Referring to FIGS. 1, 3, and 5A, the plurality of first magnets M1 may operate separately from the plurality of second magnets M2. According to example embodiments, the first angle θ1 of each of the plurality of first magnets M1 may be different from the second angle θ2 of each of the plurality of second magnets M2.

That is, the plurality of first magnets M1 constitute a first sub-group, and the plurality of second magnets M2 constitute a second sub-group. The first sub-group (that is, the plurality of first magnets M1) may be driven independently of the second sub-group (the plurality of second magnets M2).

The plurality of first magnets M1 may be driven (that is, rotated) together. Angles of the plurality of first magnets M1 may be substantially equal to each other. The plurality of second magnets M2 may be driven (that is, rotated) together. Angles of the plurality of second magnets M2 may be substantially equal to each other.

Referring to FIGS. 1, 3, 5B, and 5C, the plurality of first magnets M1 may operate oppositely to the plurality of second magnets M2. According to example embodiments, a difference between the first angle θ1 of each of the plurality of first magnets M1 and the second angle θ2 of each of the plurality of second magnets M2 may be 180 degrees. Accordingly, a magnetic field in the chamber 110 may be zero.

More specifically, FIG. 5B illustrates that the first angle θ1 is 0 degrees and the second angle θ2 is 180 degrees, and FIG. 5C illustrates that the first angle θ1 is 90 degrees and the second angle θ2 is 270 degrees (or −90 degrees).

Figure 6:
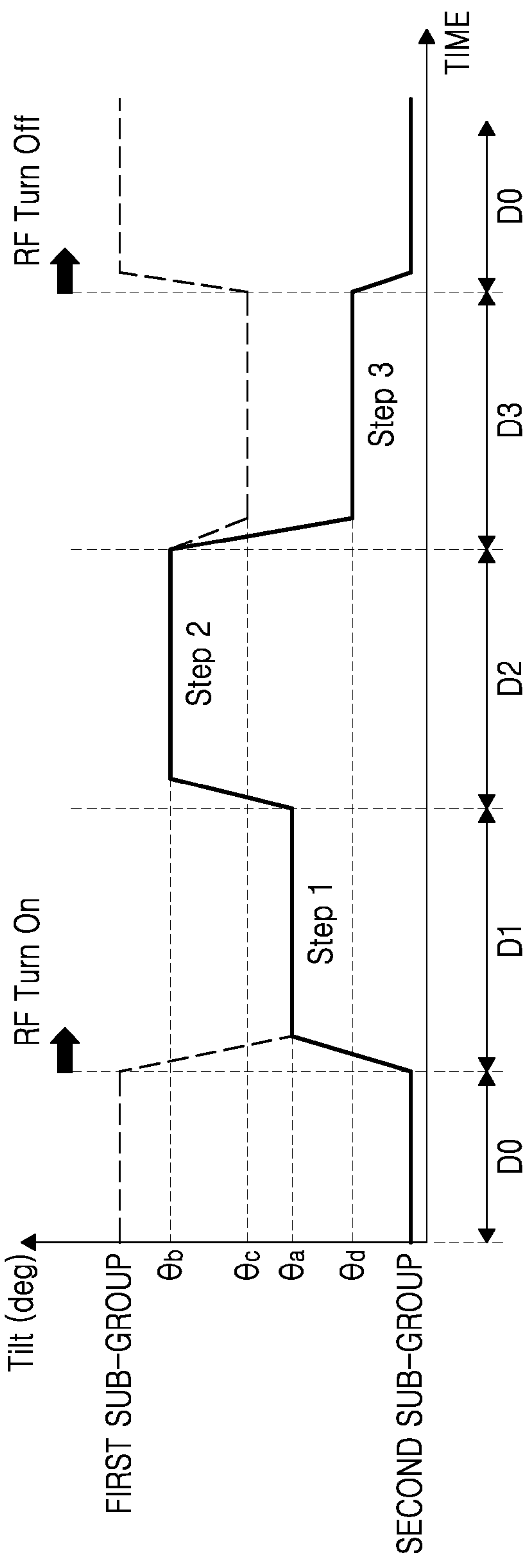
FIG. 6 is a graph illustrating an effect according to an operation of a magnet assembly.

FIG. 6 is a graph illustrating an operation of the magnet assembly 150. The operation of the magnet assembly 150 illustrated in FIG. 6 may be included in, for example, a semiconductor device manufacturing process.

Referring to FIGS. 1, 3, and 6, at an off-duty D0, the first sub-group (that is, the plurality of first magnets M1) may be in an opposite state to the second sub-group (that is, the plurality of second magnets M2). That is, a difference between the first angle θ1 of each of the plurality of first magnets M1 and the second angle θ2 of each of the plurality of second magnets M2 may be 180 degrees. Here, the off-duty D0 may be a period or section between a period or section in which plasma processing is prepared and a period or section in which plasma processing is performed. That is, during the off-duty D0, plasma may not be generated in the plasma region PR. That is, during the off-duty D0, source power may not be applied to the upper electrode 130 and the wafer support fixture 120.

The first to third duties D1, D2, and D3 may follow the off-duty D0. The first to third duties D1, D2, and D3 may correspond to periods or sections in which plasma processing is performed. Plasma may be generated in the plasma region PR during the first to third duties D1, D2, and D3.

During the first to third duties D1, D2, and D3, the first sub-group (that is, the plurality of first magnets M1) and the second sub-group (that is, the plurality of second magnets M2) may be in the same state or in different states.

For example, during the first duty D1, the first sub-group (that is, the plurality of first magnets M1) and the second sub-group (that is, the plurality of second magnets M2) may be in the same state. That is, the first angle θ1 of each of the plurality of first magnets M1 and the second angle θ2 of each of the plurality of second magnets M2 may be set to be equal to each other as an angle θ*a*.

For example, during the second duty D2, the first sub-group (that is, the plurality of first magnets M1) and the second sub-group (that is, the plurality of second magnets M2) may be in the same state. That is, the first angle θ1 of each of the plurality of first magnets M1 and the second angle θ2 of each of the plurality of second magnets M2 may be set to be equal to each other as an angle θb. The angle θ*a* may be different from the angle θb.

For example, the first duty D1 may be a preceding portion of an etching process, and the second duty D2 may be a subsequent portion of the same etching process. In this case, as the etching proceeds, a radius distribution of plasma density during the first duty D1 may be different from a radius distribution of plasma density during the second duty D2 due to an increase in reactants, an increase in debris, and charging of the wafer W. According to example embodiments, the first angle θ1 of each of the plurality of first magnets M1 and the second angle θ2 of each of the plurality of second magnets M2 may be adjusted based on an environmental change in the chamber 110 according to the progress of a process, and accordingly, the uniformity and reliability of plasma processing may be improved.

In another example, a first etching process may be performed during the first duty D1, and a second etching process different from the first etching process may be performed during the second duty D2. For example, the first etching process of the first duty D1 may be based on a first process gas, and the second etching process of the second duty D2 may be based on a second process gas that is different from the first process gas. That is, positive ions and at least one of chemical species of the plasma generated in the first etching process and the second etching process may be different from each other. The first etching process of the first duty D1 may be anisotropic etching, the positive ions may be accelerated in a direction substantially perpendicular to an upper surface of the wafer W, and the second etching process of the second duty D2 may be isotropic etching, and the positive ions may be accelerated in a direction oblique to the upper surface of the wafer W.

For example, during the third duty D3, the first sub-group (that is, the plurality of first magnets M1) may be in different states from the second sub-group (that is, the plurality of second magnets M2). That is, the first angle θ1 of each of the plurality of first magnets M1 may be set to an angle θc, and the second angle θ2 of each of the plurality of second magnets M2 may be set to an angle θd. The third duty D3 may be a subsequent portion of the same etching process as in the first and second duties D1 and D2 or may be an etching process different from the first and second duties D1 and D2.

Subsequently, after the third duty D3 ends, the off-duty D0 may start, and the first sub-group (that is, the plurality of first magnets M1) may be in an opposite state to the second sub-group (that is, the plurality of first magnets M1).

Figure 7:
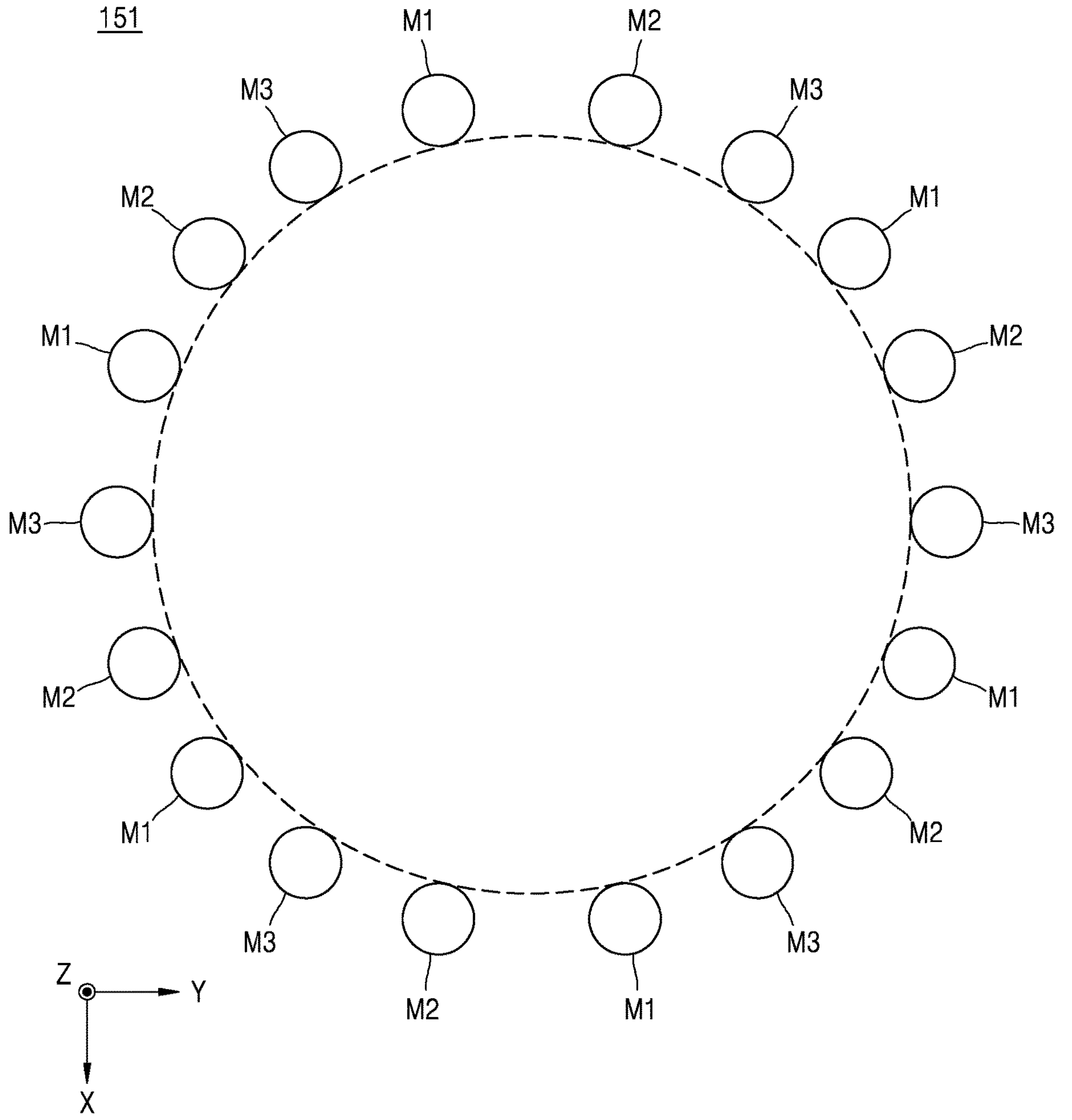
FIG. 7 is a view illustrating a magnet assembly according to example embodiments.

FIG. 7 is a view illustrating a magnet assembly 151 according to example embodiments. The magnet assembly 151 of FIG. 7 may replace the magnet assembly 150 of FIG. 1.

According to example embodiments, the magnet assembly 151 may include a plurality of first magnets M1, a plurality of second magnets M2, and a plurality of third magnets M3. The plurality of first magnets M1, the plurality of second magnets M2, and the plurality of third magnets M3 may be sequentially and alternately arranged in a circumferential direction.

For example, the second magnet M2 may follow the first magnet M1, the third magnet M3 may follow the second magnet M2, and the first magnet M1 may follow the third magnet M3 in a clockwise direction. For example, the second magnet M2 may be between the first magnet M1 and the third magnet M3, the first magnet M1 may be between the third magnet M3 and the second magnet M2, and the third magnet M3 may be between the second magnet M2 and the first magnet M1.

The plurality of first magnets M1 may constitute a first sub-group. The plurality of second magnets M2 may constitute a second sub-group. The plurality of third magnets M3 may constitute a third sub-group.

The plurality of first magnets M1, the plurality of second magnets M2, and the plurality of third magnets M3 may be rotationally symmetric to each other. That is, the plurality of first magnets M1 may overlap the plurality of second magnets M2 by rotating the plurality of first magnets M1 in a radial direction, and vice versa. In addition, the plurality of second magnets M2 may overlap the plurality of third magnets M3 by rotating the plurality of second magnets M2 in the radial direction, and vice versa. In addition, the plurality of third magnets M3 may overlap the plurality of first magnets M1 by rotating the plurality of third magnets M3 in the radial direction, and vice versa.

Those skilled in the art will be able to easily implement a magnet assembly including N sub-groups (N is an integer greater than or equal to 4) based on the description herein.

Figure 8:
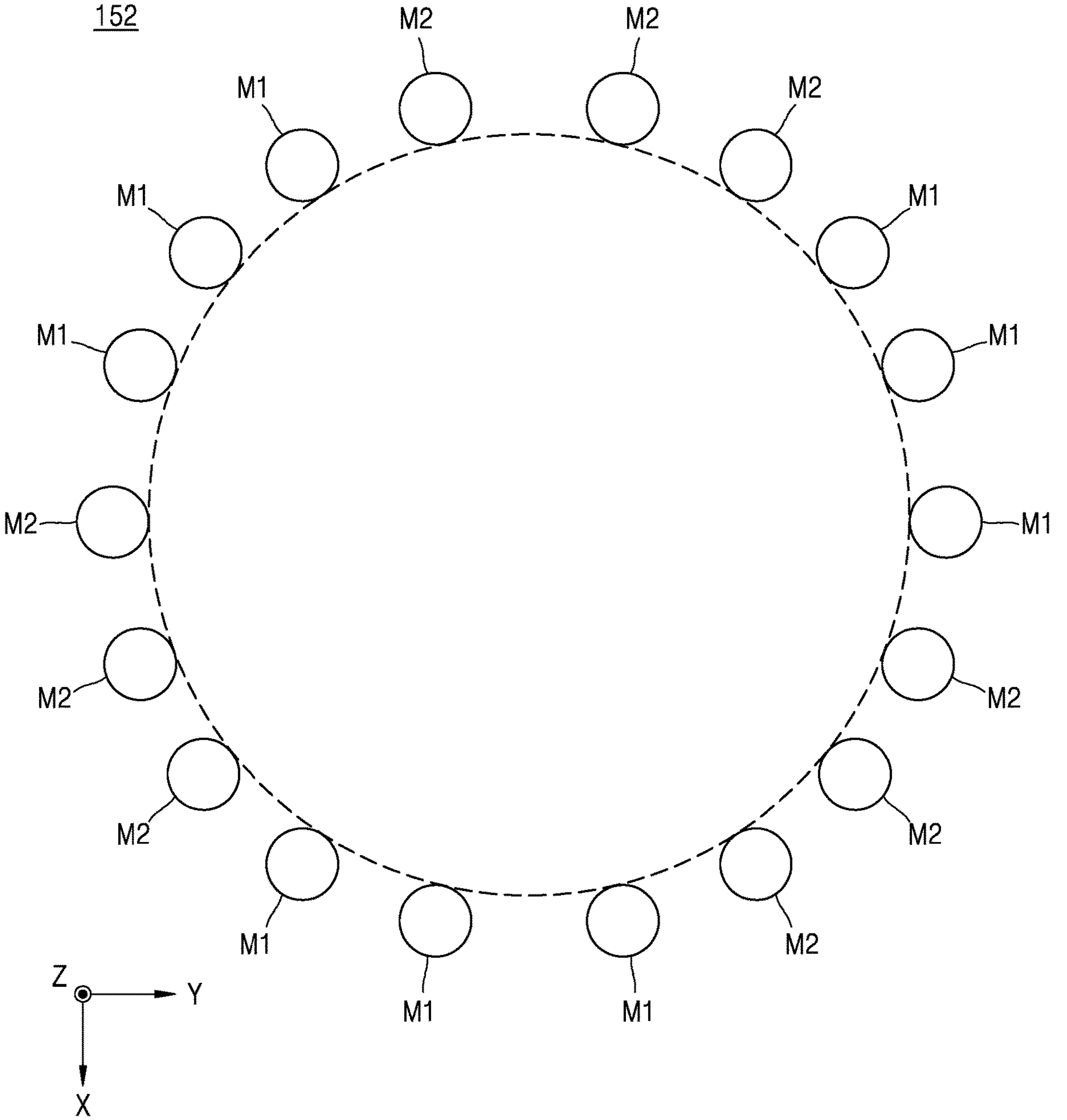
FIG. 8 is a view illustrating a magnet assembly according to example embodiments.

FIG. 8 is a view illustrating a magnet assembly 152 according to example embodiments. The magnet assembly 152 of FIG. 8 may replace the magnet assembly 150 of FIG. 1.

Referring to FIG. 8, the magnet assembly 152 may include a plurality of first magnets M1 and a plurality of second magnets M2. The plurality of first magnets M1 and the plurality of second magnets M2 may be alternately arranged in pairs (for example, three). For example, in a circumferential direction, three second magnets M2 may follow three first magnets M1, and three first magnets M1 may follow three second magnets M2.

The plurality of first magnets M1 may be rotationally symmetric to the plurality of second magnets M2. Those skilled in the art will be able to easily implement an embodiment in which the plurality of (that is, two or more) first magnets M1 and the plurality of second magnets M2 are alternately arranged in pairs based on the description herein.

Figure 9:
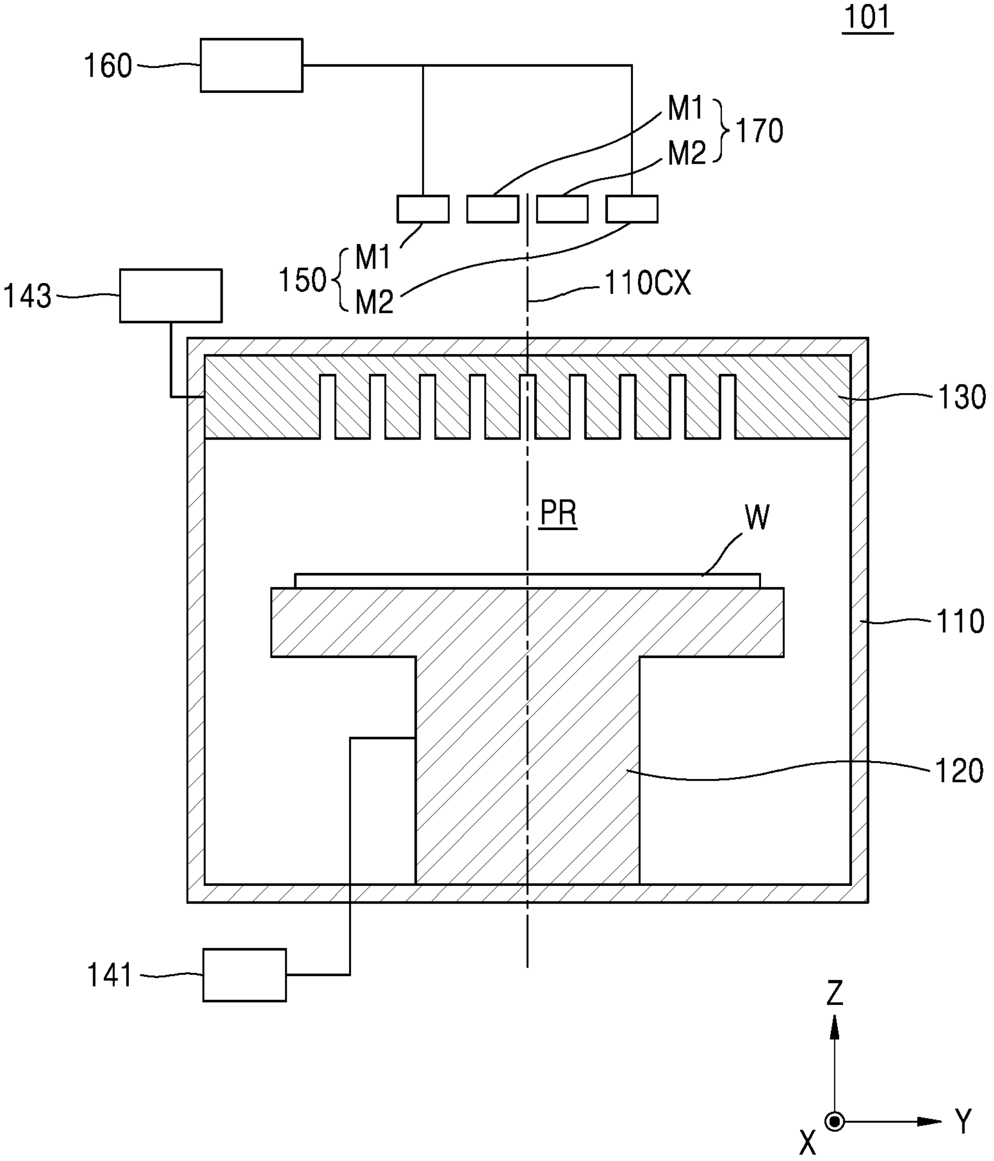
FIG. 9 is a view illustrating a plasma processing apparatus according to other example embodiments.

FIG. 9 is a view illustrating a plasma processing apparatus 101 according to other example embodiments.

Referring to FIG. 9, the plasma processing apparatus 101 may include a chamber 110, a wafer support fixture 120, an upper electrode 130, a first power generator 141, a second power generator 143, a magnet assembly 150, a controller 160, and a magnet assembly 170.

The chamber 110, the wafer support fixture 120, the upper electrode 130, the first power generator 141, the second power generator 143, and the magnet assembly 150 are substantially the same as described with reference to FIGS. 1 and 2, and thus, redundant descriptions thereof are omitted in the interest of brevity. The controller 160 is substantially the same as described with reference to FIGS. 1 and 2, except that the controller 160 further controls an operation of the magnet assembly 170 in addition to the magnet assembly 150.

Referring to FIG. 9, the magnet assembly 170 may be similar to the magnet assembly 150. The magnet assembly 170 may apply a magnetic field to the plasma region PR in the chamber 110. The magnet assembly 170 may adjust a magnetic field-radius distribution in the chamber 110. The magnetic field applied to plasma affects the density of the plasma.

The magnet assembly 170 may uniformize a radius-plasma density distribution in the plasma region PR by applying a magnetic field to the plasma region PR. Accordingly, it is possible to improve uniformity according to a radius of processing using plasma.

In addition, the magnetic field applied by the magnet assembly 170 may cancel a horizontal acceleration of positive ions of plasma. Accordingly, orthogonality of an etch profile of an etch process by the plasma processing apparatus 101 may be improved.

The magnet assembly 170 may include a plurality of first magnets M1 and a plurality of second magnets M2. The plurality of first magnets M1 and the plurality of second magnets M2 of the magnet assembly 170 may be arranged in an annular or ring shape. The plurality of first magnets M1 and the plurality of second magnets M2 of the magnet assembly 170 may be at the same radius from a central axis 110CX of the chamber 110.

A distance (for example, a horizontal distance) from the central axis 110CX of the chamber 110 to the plurality of first magnets M1 and the plurality of second magnets M2 of the magnet assembly 170 may be different from the distance from the central axis 110CX of the chamber 110 to the plurality of first magnets M1 and the plurality of second magnets M2 of the magnet assembly 150. The distance (for example, the horizontal distance) from the central axis 110CX of the chamber 110 to the plurality of first magnets M1 and the plurality of second magnets M2 of the magnet assembly 170 may be less than the distance from the central axis 110CX of the chamber 110 to the plurality of first magnets M1 and the plurality of second magnets M2 of the magnet assembly 150. The magnet assembly 150 may surround the magnet assembly 170.

In some cases, for the sake of convenience of description, the magnet assembly 150 may be referred to as a first magnet assembly, and the magnet assembly 170 may be referred to as a second magnet assembly. In addition, in order to distinguish from the plurality of first magnets M1 and the plurality of second magnets M2 of the magnet assembly 150, the plurality of first magnets M1 and the plurality of second magnets M2 of the magnet assembly 170 may be referred to respectively as a plurality of third magnets and a plurality of fourth magnets.

Figure 10:
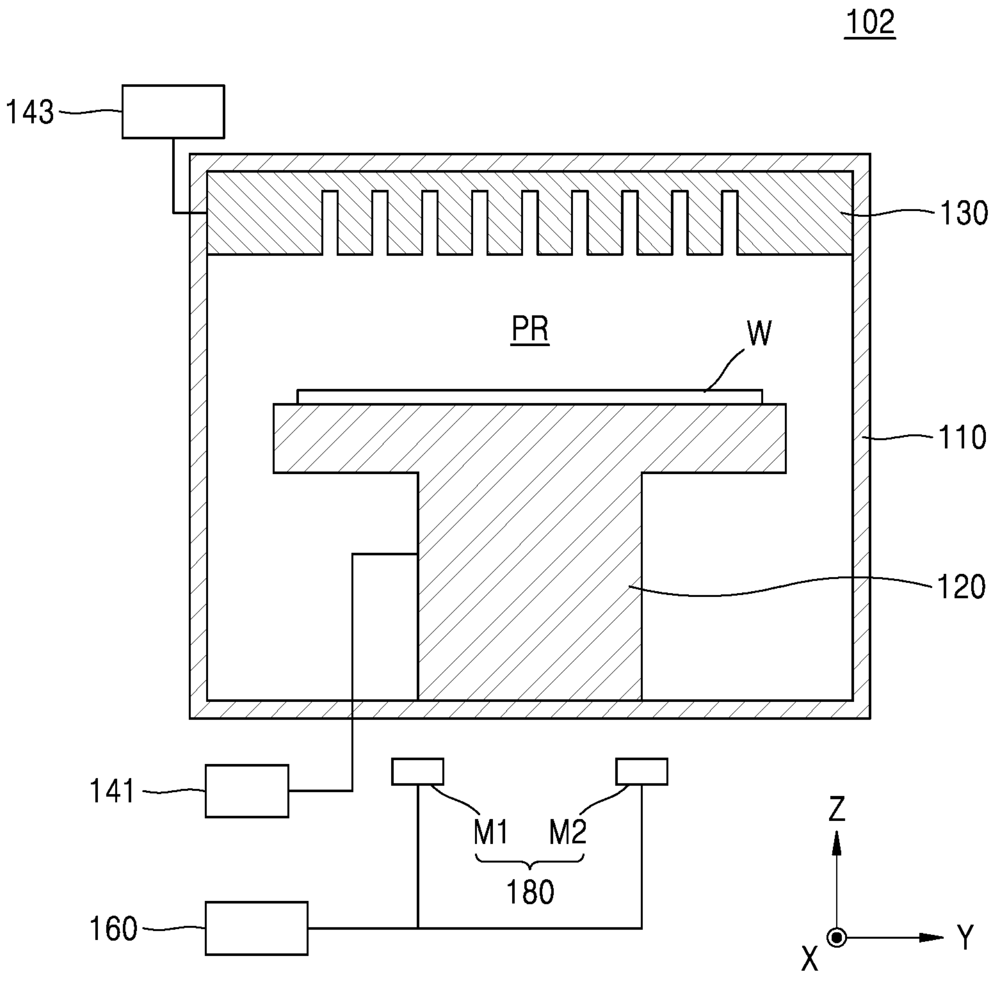
FIG. 10 is a view illustrating a plasma processing apparatus according to other example embodiments.

FIG. 10 is a view illustrating a plasma processing apparatus 102 according to other example embodiments.

Referring to FIG. 10, the plasma processing apparatus 102 may include a chamber 110, a wafer support fixture 120, an upper electrode 130, a first power generator 141, a second power generator 143, a controller 160, and a magnet assembly 180.

The chamber 110, the wafer support fixture 120, the upper electrode 130, the first power generator 141, and the second power generator 143 are substantially the same as described with reference to FIGS. 1 and 2, and thus, redundant descriptions thereof are omitted in the interest of brevity. The controller 160 is substantially the same as described with reference to FIGS. 1 and 2, except for further controlling an operation of the magnet assembly 180.

The magnet assembly 180 may be similar to the magnet assembly 150 of FIG. 1. The magnet assembly 180 may include a plurality of first magnets M1 and a plurality of second magnets M2. The magnet assembly 180 is substantially the same as the magnet assembly 150 except that the magnet assembly 180 is below (that is, below a bottom surface of the chamber 110) the chamber 110. The magnet assembly 180 may be separated or spaced apart from the upper electrode 130 with the wafer support fixture 120 therebetween.

Figure 11:
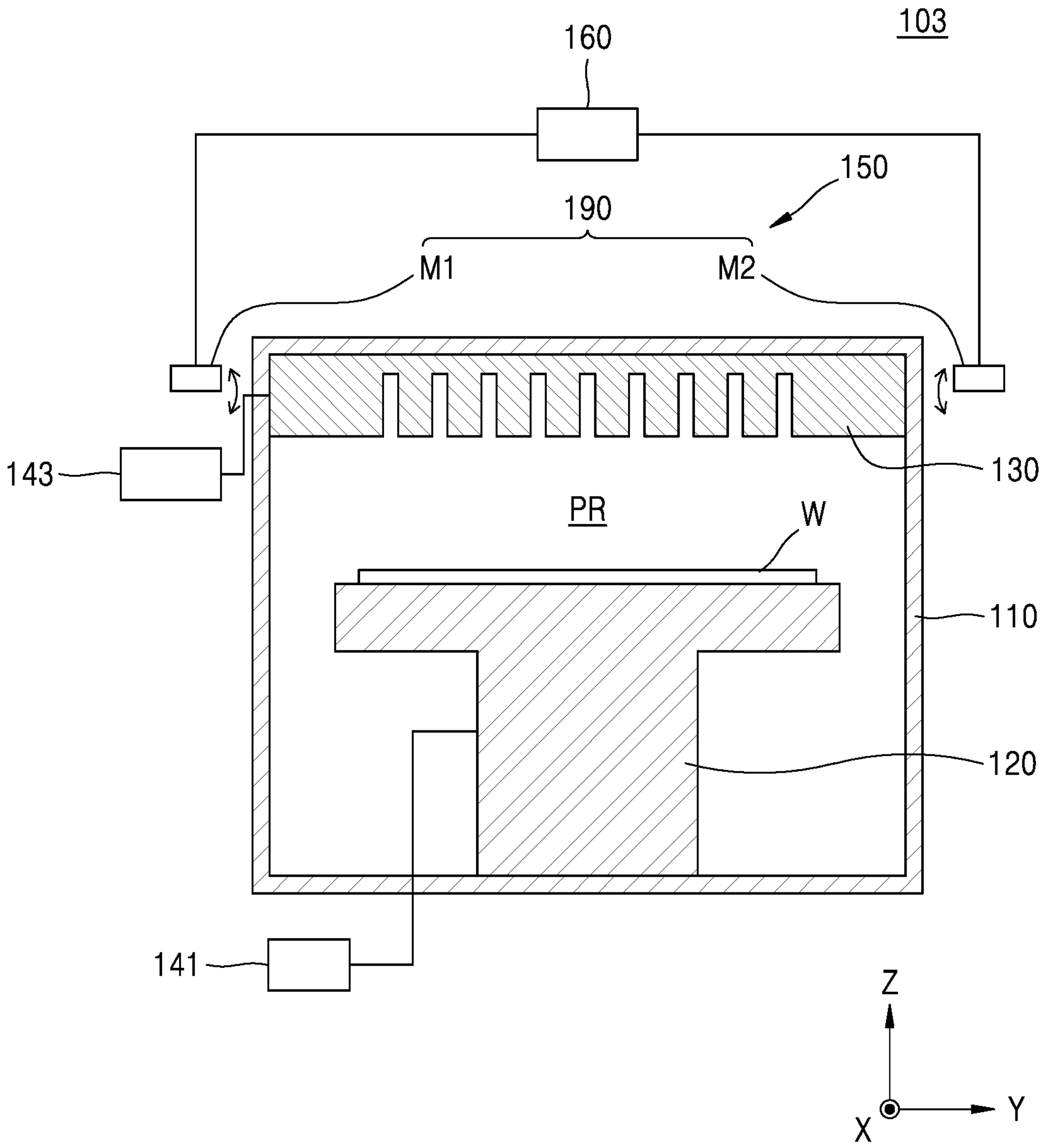
FIG. 11 is a view illustrating a plasma processing apparatus according to other example embodiments.

FIG. 11 is a view illustrating a plasma processing apparatus 103 according to other example embodiments.

Referring to FIG. 11, the plasma processing apparatus 103 may include a chamber 110, a wafer support fixture 120, an upper electrode 130, a first power generator 141, a second power generator 143, a controller 160, and a magnet assembly 190.

The chamber 110, the wafer support fixture 120, the upper electrode 130, the first power generator 141, and the second power generator 143 are substantially the same as described with reference to FIGS. 1 and 2, and thus, redundant descriptions thereof are omitted in the interest of brevity. The controller 160 is substantially the same as described with reference to FIGS. 1 and 2, except for further controlling an operation of the magnet assembly 190.

The magnet assembly 190 may be similar to the magnet assembly 150 of FIG. 1. The magnet assembly 190 may include a plurality of first magnets M1 and a plurality of second magnets M2. The magnet assembly 190 is substantially the same as the magnet assembly 150 except that the magnet assembly 190 is on the side of the chamber 110. That is, the magnet assembly 190 may be between the floor or bottom and the ceiling or top of the chamber 110 in the Z direction.

While the inventive concept has been particularly shown and described with reference to embodiments thereof, it will be understood that various changes in form and details may be made therein without departing from the scope of the following claims.

What is claimed is:

1. A plasma processing apparatus comprising:

a wafer support fixture in a chamber and configured to support a wafer;

an upper electrode in the chamber and spaced apart from the wafer support fixture; and a magnet assembly configured to apply a magnetic field into the chamber, wherein the magnet assembly comprises a plurality of first magnets and a plurality of second magnets arranged in an annular shape, and a horizontal distance from a central axis of the chamber to each of the plurality of first magnets and to each of the plurality of second magnets is less than a radius of the wafer, wherein each of the plurality of first magnets and the plurality of second magnets is configured to rotate such that a direction in which an N pole of each of the plurality of first magnets faces and a direction in which an N pole of each of the plurality of second magnets faces are angled with respect to the central axis of the chamber.

2. The plasma processing apparatus of claim 1, wherein the plurality of first magnets are configured to rotate separately from the plurality of second magnets.

3. The plasma processing apparatus of claim 2, wherein the plurality of first magnets are configured to rotate together, and the plurality of second magnets are configured to rotate together.

4. The plasma processing apparatus of claim 1, wherein, when plasma is not generated in the chamber, the N pole of each of the plurality of first magnets face opposite direction from the N pole of each of the plurality of second magnets.

5. The plasma processing apparatus of claim 1, wherein the plurality of first magnets are rotationally symmetric to the plurality of second magnets.

6. The plasma processing apparatus of claim 1, wherein the plurality of first magnets and the plurality of second magnets are alternately arranged.

7. The plasma processing apparatus of claim 1, wherein the plurality of first magnets and the plurality of second magnets are alternately arranged in groups of two or more.

8. The plasma processing apparatus of claim 1, wherein the magnet assembly further comprises a plurality of third magnets arranged in the annular shape together with the plurality of first magnets and the plurality of second magnets, and the plurality of first magnets, the plurality of second magnets, and the plurality of third magnets are alternately arranged in a circumferential direction.

9. The plasma processing apparatus of claim 8, wherein the plurality of first magnets define a first sub-group of magnets, the plurality of second magnets define a second sub-group of magnets, the plurality of third magnets define a third sub-group of magnets, and the first sub-group of magnets, the second sub-group of magnets, and the third sub-group of magnets are configured to rotate independently from each other.

10. The plasma processing apparatus of claim 1, wherein the plurality of first magnets and the plurality of second magnets are configured to rotate in a first direction such that a magnetic field applied into the chamber has a greater intensity in an edge portion of the chamber than in a central portion of the chamber, and the plurality of first magnets and the plurality of second magnets are configured to rotate in a second direction opposite to the first direction such that the magnetic field has a greater intensity in the central portion of the chamber than in the edge portion of the chamber.

11. A plasma processing apparatus comprising:

a chamber configured to provide a plasma region in which plasma is generated;

a wafer support fixture configured to receive bias power for accelerating positive ions included in the plasma;

a controller; and a first magnet assembly configured to adjust a density-radius distribution of the plasma in the chamber, wherein the first magnet assembly comprises a plurality of first magnets and a plurality of second magnets arranged in a ring shape, the controller is configured to rotate the plurality of first magnets and the plurality of second magnets such that a direction extending away from an N pole of each of the plurality of first magnets and the plurality of second magnets can have any angle with respect to vertical, and the controller is configured to rotate the plurality of first magnets separately from the plurality of second magnets.

12. The plasma processing apparatus of claim 11, wherein the first magnet assembly is above the chamber.

13. The plasma processing apparatus of claim 11, wherein the first magnet assembly is under the chamber.

14. The plasma processing apparatus of claim 11, wherein the first magnet assembly surrounds a side surface of the chamber.

15. The plasma processing apparatus of claim 11, wherein the wafer support fixture is configured to support a wafer processed by the plasma, and a horizontal distance from a central axis of the chamber to each of the plurality of first magnets and a horizontal distance from the central axis of the chamber to each of the plurality of second magnets are less than a radius of the wafer.

16. The plasma processing apparatus of claim 15, further comprising:

a second magnet assembly configured to adjust a density-radius distribution of the plasma in the chamber, wherein the second magnet assembly comprises a plurality of third magnets and a plurality of fourth magnets arranged in a ring shape, and a horizontal distance from the central axis of the chamber to each of the plurality of third magnets and a horizontal distance from the central axis of the chamber to each of the plurality of fourth magnets are less than the horizontal distance from the central axis of the chamber to each of the plurality of first magnets and the horizontal distance from the central axis of the chamber to each of the plurality of second magnets.

17. A plasma processing apparatus comprising:

a chamber configured to provide a plasma region in which plasma is generated; and a magnet assembly configured to adjust a density-radius distribution of the plasma in the chamber by applying a magnetic field to the plasma region, wherein the magnet assembly comprises a plurality of first magnets and a plurality of second magnets arranged in a ring, the plurality of first magnets and the plurality of second magnets are configured to rotate about a circumference of the ring, the magnet assembly is configured to rotate the plurality of first magnets and the plurality of second magnets in a first direction to set an intensity of the magnetic field at a central portion of the chamber to be greater than an intensity of the magnetic field in an edge portion of the chamber, and the magnet assembly is configured to rotate the plurality of first magnets and the plurality of second magnets in a second direction opposite to the first direction to set the intensity of the magnetic field at the central portion of the chamber to be less than the intensity of the magnetic field in the edge portion of the chamber.

18. The plasma processing apparatus of claim 17, wherein the plurality of first magnets are configured to rotate separately from the plurality of second magnets.

19. The plasma processing apparatus of claim 17, wherein the plurality of first magnets are configured to rotate together, and the plurality of second magnets are configured to rotate together.

* * * * *